(12) United States Patent
Soss et al.

(10) Patent No.: US 8,048,790 B2
(45) Date of Patent: Nov. 1, 2011

(54) METHOD FOR SELF-ALIGNING A STOP LAYER TO A REPLACEMENT GATE FOR SELF-ALIGNED CONTACT INTEGRATION

(75) Inventors: Steven R. Soss, Monroe, NY (US); Andreas Knorr, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 197 days.

(21) Appl. No.: 12/561,708

(22) Filed: Sep. 17, 2009

(65) Prior Publication Data
US 2011/0062501 A1   Mar. 17, 2011

(51) Int. Cl.
*H01L 21/00* (2006.01)
(52) U.S. Cl. ........................... 438/585; 438/926
(58) Field of Classification Search .......... 438/585–595, 438/926
See application file for complete search history.

(56) References Cited

U.S. PATENT DOCUMENTS

| | | | | |
|---|---|---|---|---|
| 6,054,355 | A | * | 4/2000 | Inumiya et al. ............... 438/296 |
| 6,080,615 | A | * | 6/2000 | Lee et al. ...................... 438/239 |
| 6,204,137 | B1 | * | 3/2001 | Teo et al. ...................... 438/305 |
| 7,091,118 | B1 | | 8/2006 | Pan et al. |
| 2004/0175910 | A1 | | 9/2004 | Pan et al. |

OTHER PUBLICATIONS

Fastow, R. et al., A 45nm NOR Flash Technology with Self-Aligned Contacts and 0.024um2 Cell Size for Multi-level Applications, 2008, pp. 1-2, US.
Ishigaki, Y. et al., "Low Parasitic Resistance Technologies with NES-SAC and SWT-CVD Process for Low Supply Voltage, High Speed BiCMOS SRAMs", Symposium on VLSI Technology Digest of Technical Papers, 1994, pp. 99-100, Japan.

* cited by examiner

*Primary Examiner* — Richard A. Booth
(74) *Attorney, Agent, or Firm* — Ditthavong Mori & Steiner, P.C.

(57) ABSTRACT

Semiconductor devices with replacement gate electrodes and integrated self aligned contacts are formed with enhanced gate dielectric layers and improved electrical isolation properties between the gate line and a contact. Embodiments include forming a removable gate electrode on a substrate, forming a self aligned contact stop layer over the removable gate electrode and the substrate, removing a portion of the self aligned contact stop layer over the removable gate electrode and the electrode itself leaving an opening, forming a replacement gate electrode of metal, in the opening, transforming an upper portion of the metal into a dielectric layer, and forming a self aligned contact. Embodiments include forming the contact stop layer of a dielectric material, e.g., a hafnium oxide, an aluminum oxide, or a silicon carbide and transforming the upper portion of the metal into a dielectric layer by oxidation, fluorination, or nitridation. Embodiments also include forming a hardmask layer over the removable gate electrode to protect the electrode during silicidation in source/drain regions of the semiconductor device.

12 Claims, 6 Drawing Sheets

US 8,048,790 B2

METHOD FOR SELF-ALIGNING A STOP LAYER TO A REPLACEMENT GATE FOR SELF-ALIGNED CONTACT INTEGRATION

TECHNICAL FIELD

The present disclosure relates to a method of fabricating semiconductor devices with metal gates and the resulting devices. The present disclosure is particularly applicable in fabricating semiconductor devices with metal replacement gates and self-aligned contacts.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

Additional issues arise with lateral scaling, such as the formation of contacts. For example, once the contacted poly pitch gets to about 80 nanometers (nm), there is not enough room to land a contact between the gate lines and still maintain good electrical isolation properties between the gate line and the contact. Self aligned contact (SAC) methodology has been developed to address this problem. However, conventional SAC approaches involve metalizing the gate prior to patterning, followed by covering the gate with a hardmask to isolate the gate line from the contact during the contact etch and fill process. This approach, however, is not compatible with the replacement gate process.

A need therefore exists for methodology enabling the fabrication of semiconductor devices comprising integrating both metal replacement gates and self aligned contacts.

SUMMARY

An aspect of the present disclosure is an efficient method of fabricating a semiconductor device with integrated self aligned contacts and replacement gate electrodes.

Another aspect of the present disclosure is a semiconductor device comprising integrated self aligned contacts and replacement gate electrodes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: forming a removable gate electrode over a substrate; forming an SAC stop layer over the removable gate electrode and the substrate; removing a portion of the SAC stop layer over the removable gate electrode; removing the removable gate electrode leaving an opening; forming a replacement gate electrode, comprising a metal, in the opening; transforming an upper portion of the metal into a dielectric layer; and forming an SAC.

Aspects of the present disclosure include forming spacers on side surfaces of the removable gate electrode, and forming the SAC stop layer over the spacers. Further aspects include transforming the upper portion of the metal into a dielectric layer by oxidation or nitridation, or fluorination. Another aspect includes anodizing an upper portion of the metal, which comprises aluminum, to form aluminum oxide ($Al_2O_3$). Additional aspects include forming devices wherein the SAC stop layer comprises a dielectric material, i.e., a hafnium oxide, an aluminum oxide, or a silicon carbide, for example a hafnium oxide. Aspects also include depositing the dielectric material by atomic layer deposition (ALD) or by chemical vapor deposition (CVD) at a thickness of about 1 to about 10 nm. Further aspects include forming a hardmask layer on the removable gate electrode, forming a contacted diffusion area spaced from the removable gate electrode by the spacers, and forming a silicide in the area spaced from the removable gate electrode by the spacers, all prior to depositing the SAC stop layer. Another aspect includes providing an isolation material filling a space in the area spaced from the removable gate electrode by the spacers after forming the SAC stop layer, forming the replacement gate electrode, transforming the upper portion of the metal into a dielectric layer, and etching, with a high etch selectivity to the isolation material with respect to the dielectric layer, i.e., an etch selectivity of about 4:1 or greater, to remove the isolation material in order to form a contact hole.

Another aspect of the present disclosure is a semiconductor device comprising: a gate electrode, comprising a metal, over a substrate; an SAC stop layer over the substrate; a dielectric layer selectively formed from an upper portion of the metal gate electrode; and an SAC through the SAC stop layer and/or through the dielectric layer.

Aspects include spacers on side surfaces of the gate electrode, wherein the SAC stop layer is over the spacers. Another aspect includes semiconductor devices wherein the dielectric layer comprising a nitride or an oxide. Further aspects include semiconductor devices comprising an aluminum replacement gate with a dielectric layer thereon comprising aluminum oxide ($Al_2O_3$) formed by anodizing the aluminum. Additional aspects include semiconductor devices wherein the SAC stop layer comprises a dielectric material, i.e., a hafnium oxide, an aluminum oxide, or a silicon carbide, for example a hafnium oxide. Other aspects include semiconductor devices wherein a silicide is formed spaced from the gate electrode by the spacers under the SAC stop layer.

A further aspect of the present disclosure includes forming a first gate electrode over a substrate, the first gate electrode comprising a high-K gate dielectric layer, a metal layer on the gate dielectric layer, and polysilicon; forming spacers on side surfaces of the first gate electrode; forming a hardmask over the polysilicon; forming a silicide on the substrate; depositing an SAC stop layer over the hardmask layer, the spacers, and the silicide; depositing an isolation material over the SAC stop layer; forming a replacement gate electrode by: removing the hardmask layer and the polysilicon from the first gate electrode to form an opening; depositing a metal lining in the opening; and depositing aluminum on the metal lining in the opening; anodizing an upper portion of the aluminum to form a layer of aluminum oxide ($Al_2O_3$); etching, with a high etch selectivity to the isolation material with respect to the $Al_2O_3$ layer, to remove isolation material to form a contact hole and/or to remove the $Al_2O_3$ from the replacement gate electrode; and forming an SAC on the silicide and/or the replacement gate electrode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
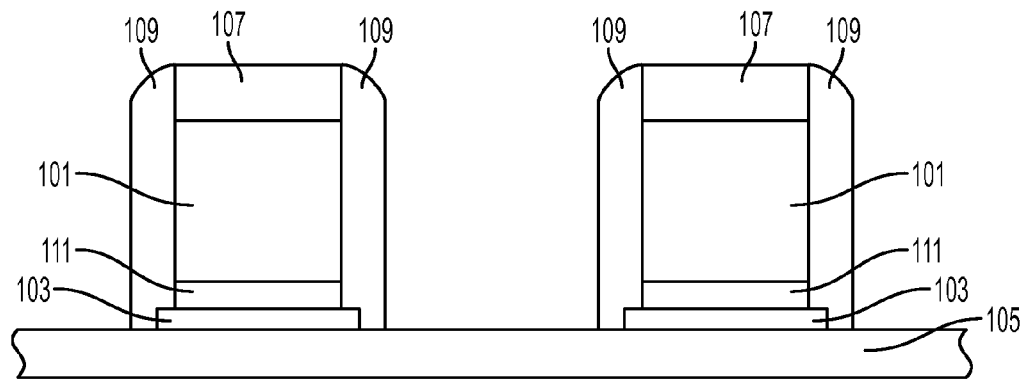
FIGS. 1-3 schematically illustrate SAC process steps, according to an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments.

The present disclosure addresses and solves the problem of degraded gate dielectrics and poor electrical isolation properties between the gate line and contacts that result from the use of metal gate electrodes and insufficient space for etching contacts. In accordance with embodiments of the present disclosure, a replacement gate electrode process is efficiently integrated with an SAC process. The use of a replacement gate electrode improves drive current without degrading the gate dielectric, while forming SACs improves electrical isolation properties between the gate line and the contact.

Embodiments of the present disclosure include forming a removable gate electrode, e.g., of polysilicon, over a substrate. A high-K dielectric layer and metal layer may be formed on the substrate under the polysilicon. An SAC stop layer, e.g., a dielectric material, for example a hafnium oxide, an aluminum oxide, or a silicon carbide, is formed over the removable gate electrode and the substrate, e.g., by ALD or CVD at a thickness of about 1 to about 10 nm. A portion of the SAC stop layer over the removable gate electrode and the removable gate electrode itself are then removed, leaving an opening. A replacement gate electrode, comprising a metal, is formed in the opening. A metal lining, corresponding to the metal previously deposited with the high-K dielectric layer, may be formed in the opening prior to forming the replacement gate electrode. An upper portion of the metal of the replacement gate electrode is transformed into a dielectric layer, and an SAC is formed. In accordance with embodiments of the present disclosure, spacers may be formed on side surfaces of the removable gate electrode, and the SAC stop layer may be formed over the spacers. Also, a hardmask layer may be formed on the removable gate electrode, a silicide may be formed in the area spaced from the removable gate electrode by the spacers prior to depositing the SAC stop layer. The transformation of the upper portion of the metal into a dielectric may be performed by oxidation or nitridation or fluorination. If, for example, the metal of the replacement gate electrode comprises aluminum, the transformation may be implemented by anodizing an upper portion of the aluminum to form aluminum oxide ($Al_2O_3$). In addition, an isolation material may be provided, e.g, by deposition, in the space between the gate electrodes after forming the SAC stop layer, and after transforming the upper portion of the metal into the dielectric layer. The isolation material may then be etched, with a high etch selectivity to the isolation material with respect to the dielectric layer, e.g., about 4:1 to about 8:1, to remove the isolation material between the gate electrodes to form the contact hole, and the SAC may be formed on the silicide after removal of the SAC stop layer. Alternatively, or additionally, the dielectric may be etched from the replacement gate electrode and a contact may be formed on the replacement gate electrode.

A semiconductor device in accordance with embodiments of the present disclosure includes a gate electrode, comprising a metal, over a substrate, and an SAC stop layer over the substrate. The device further includes a dielectric layer selectively formed from an upper portion of the metal gate electrode, and a self aligned contact through the SAC stop layer and/or through the dielectric layer. The device may include spacers on side surfaces of the gate electrode, such that the SAC stop layer is over the spacers. The device may further include a silicide spaced from the gate electrode by the spacers under the SAC stop layer. The SAC stop layer may comprise a dielectric material, e.g., a hafnium oxide, an aluminum oxide, or a silicon carbide. The dielectric layer may comprise a nitride or an oxide. If, for example, the metal of the gate electrode comprises aluminum, the dielectric layer may comprise aluminum oxide ($Al_2O_3$) formed by anodizing the aluminum.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
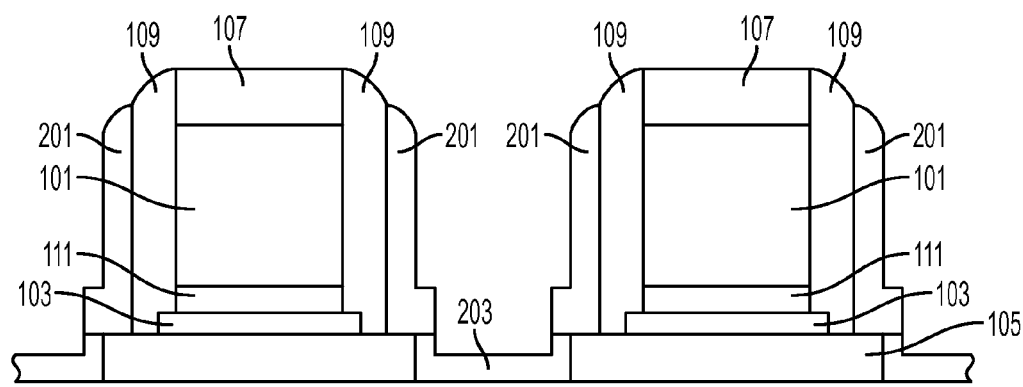

Adverting to FIG. 1, a method for forming a semiconductor, in accordance with an exemplary embodiment, begins with a SAC process. A removable gate electrode 101, for example of polysilicon, is formed on gate dielectric layer 103, on a silicon substrate 105. Gate dielectric 103 may be a high-K dielectric, for example having a dielectric constant of about 25 or greater, and a thin metal layer 111, e.g., of titanium nitride (TiN), may be deposited on the gate dielectric layer 103. A nonconductive hardmask layer 107, such as a nitride, is formed on gate electrode 101 to prevent the gate electrodes from being exposed during later source/drain silicidation. Sidewall spacers 109 are formed on both sides of gate electrode 103 to encapsulate the gate electrode As illustrated in FIG. 2, additional spacers 201 are formed on spacers 109 to define the area for silicidation over source/drain regions of the semiconductor device. Although only two sets of spacers (109 and 201) are shown, any number of spacers may be included. Next, a metal silicide 203, e.g., nickel or nickel platinum silicide, is formed on substrate 105 in the region between the spacers.

Figure 3:
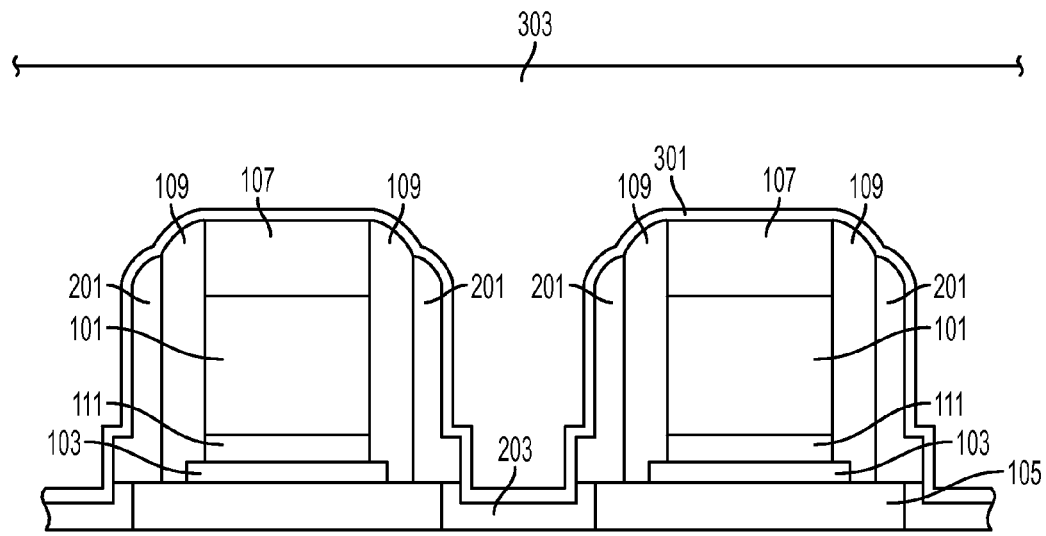

After the silicidation, an SAC stop layer 301 is conformally deposited over spacers 201 and 109, hardmask layer 107, and silicide 203, as shown in FIG. 3. SAC stop layer 301 may be, for example, a hafnium oxide (HfOx), an aluminum oxide, a silicon carbide, or any highly etch resistant dielectric material that is different from the spacers and exhibits good conformality. Stop layer 301 may be deposited to a thickness of about 1 nm to about 10 nm, e.g., about 2 nm. An isolation material, e.g. an oxide or an oxide plus a stress material, such as a nitride, is deposited over the entire substrate to form isolation layer 303.

Figure 4:
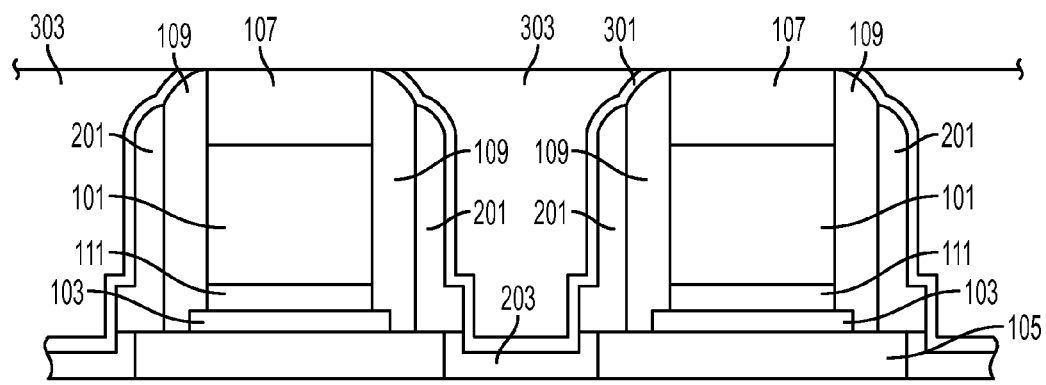
FIGS. 4-8 schematically illustrate replacement gate electrode process steps, according to an exemplary embodiment.

Adverting to FIG. 4, the method continues with the replacement gate process. Isolation layer 303 and SAC stop layer 301 are polished, e.g., by chemical mechanical polishing (CMP), down to hardmask layer 107. Alternatively, isolation layer 303 may be polished back to the stop layer 301, and then the stop layer may be etched off, stopping at hardmask layer 107.

Figure 5:
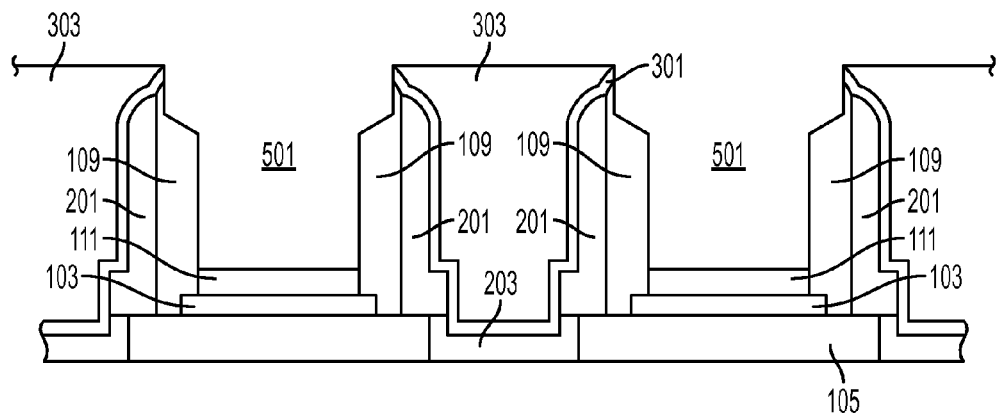

After hardmask layer 107 is exposed, hardmask layer 107 and removable gate electrode 101 are removed, forming cavity 501, as illustrated in FIG. 5. Wet chemistry and/or a combination of dry and wet chemistries may be employed for removing hardmask layer 107 and removable gate electrode 101.

Figure 6:
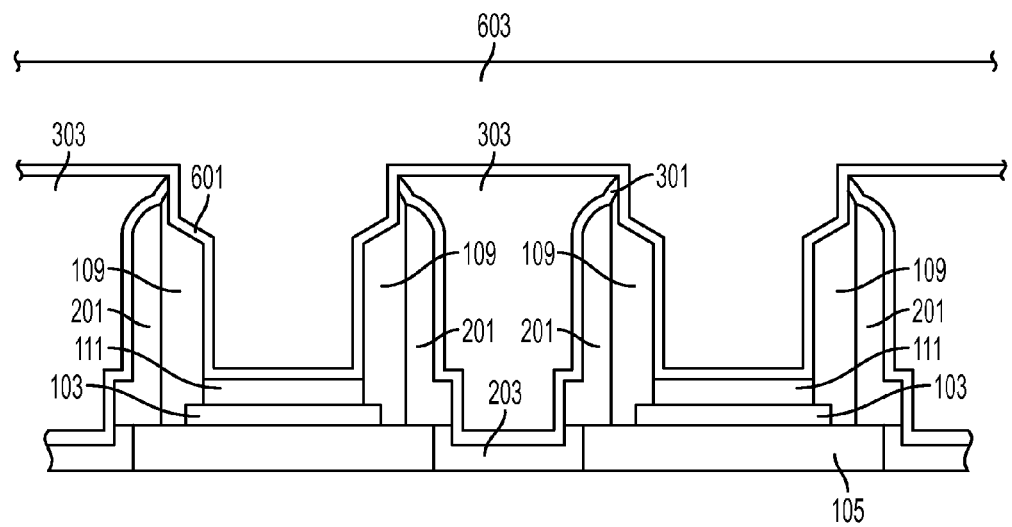
Figure 7:
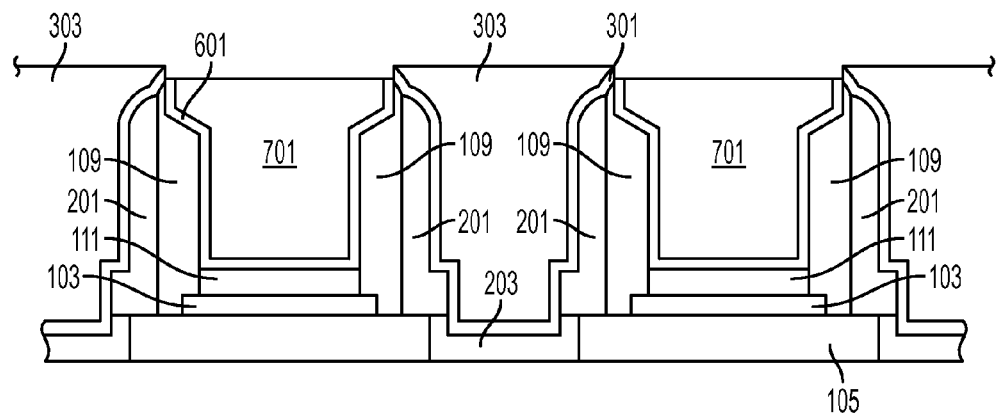

As illustrated in FIG. 6, a metal lining 601, e.g., a TiN layer, is then conformally deposited on isolation layer 303 and on the sidewalls and bottom surface of cavity 501 as a barrier layer. A metal layer 603, e.g., aluminum, is then deposited in cavity 501 and on metal lining 601. Metal layer 603 may alternatively be any metal, e.g., titanium, that can be selectively grown into a dielectric material, e.g., by nitridation or direct thermal oxidation. Metal layer 603 is then polished back to self align the replacement gate metal to the gate lines, thereby forming replacement gate electrode 701, as illustrated in FIG. 7.

Figure 8:
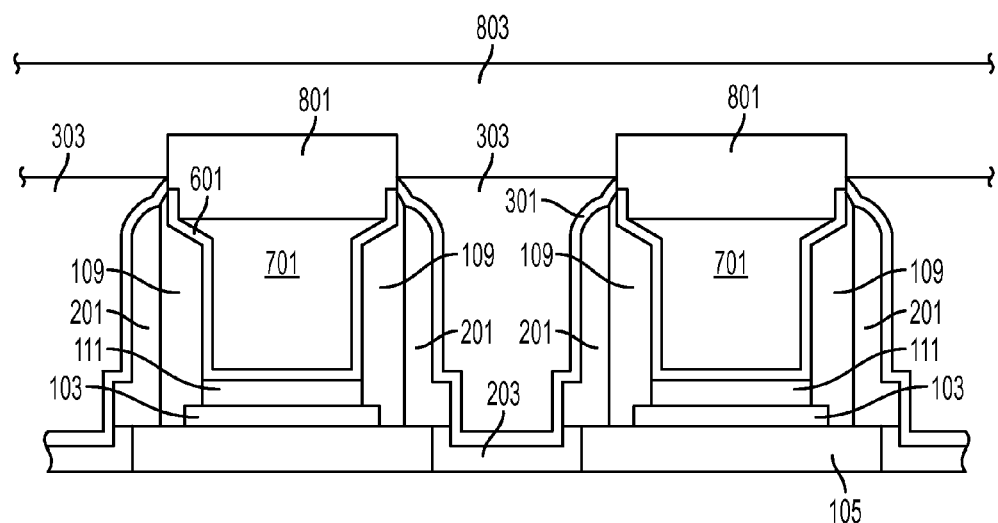

Adverting to FIG. 8, the top portion of metal layer 701 is nitrided, fluorinated, or oxidized to form dielectric layer 801. For an aluminum (Al) metal layer 701, the top portion may be anodized to form an $Al_2O_3$ dielectric layer 801. Due to the nature of the annodization process, the $Al_2O_3$ formed is selective only to the gate layer. This completes the replacement gate process. Capping layer 803, e.g., an interlayer dielectric, is then deposited over the entire surface to cap the gates, and the SAC process continues.

Figure 9A:
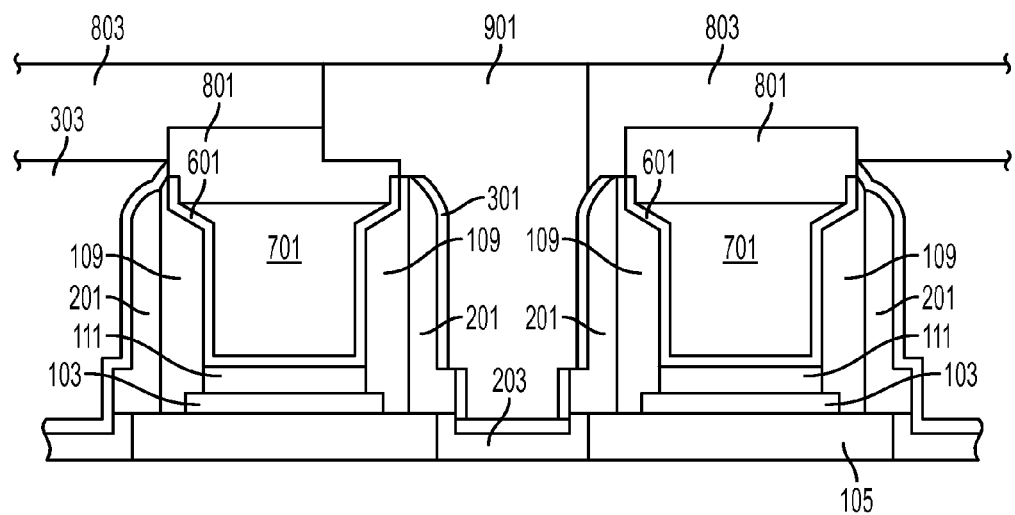
FIGS. 9A-9C schematically illustrate three different types of SACs, according to an exemplary embodiment.
Figure 9B:
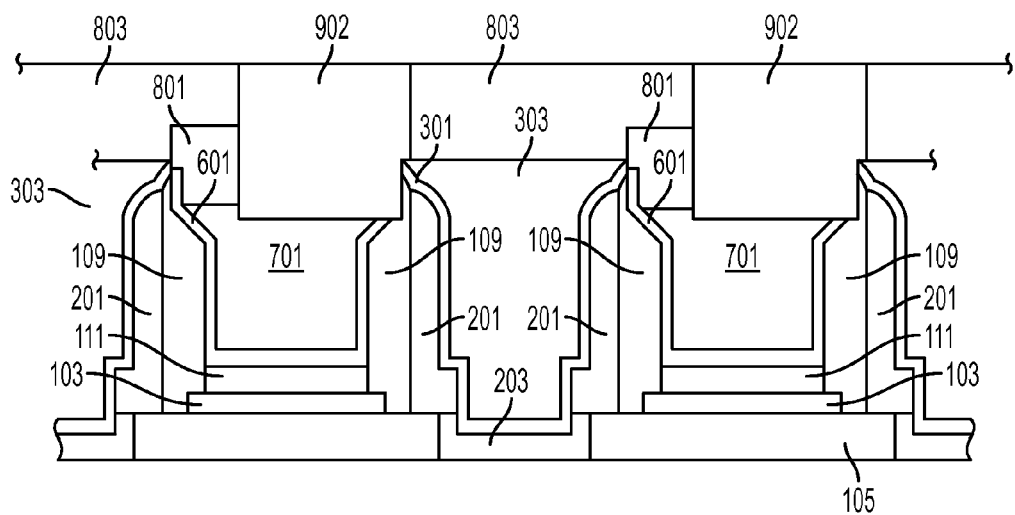
Figure 9C:
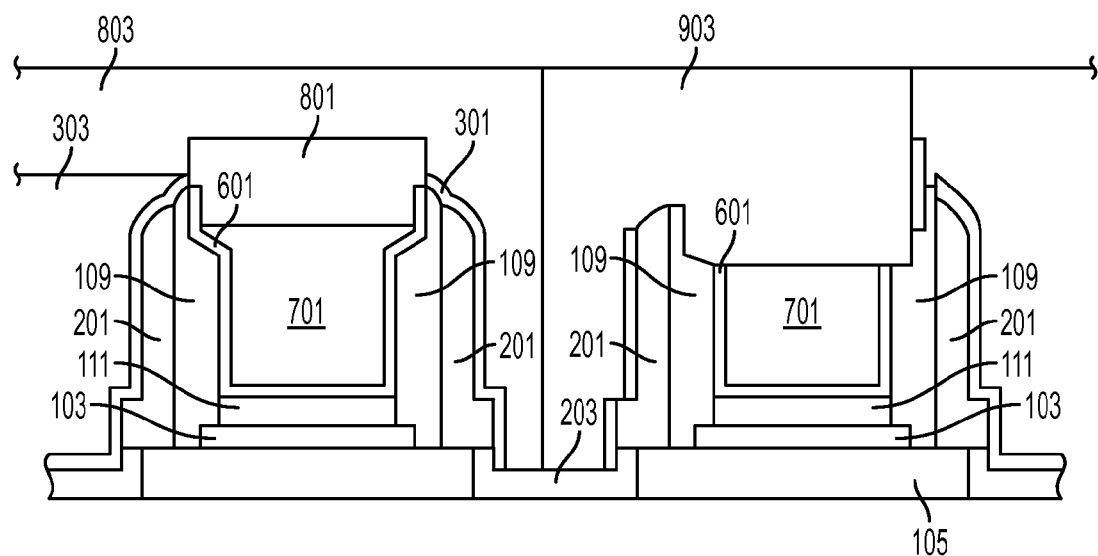

FIGS. 9A to 9C illustrate three different types of SACs formed according to an exemplary embodiment. Adverting to FIG. 9A, capping layer 803 and isolation layer 303 are etched to form the contact hole. FIG. 9A indicates a misregistration of the contact hole 901 such that it lands over a portion of dielectric layer 801. The contact etch is prevented from reaching the gate electrode 701 and spacers 109 and 201 due to the high etch resistance of layers 801 and 301. Then the SAC stop layer 301 is etched from the bottom of the contact hole to expose silicide 203. A contact material fills the contact hole to form contact 901. During the etching of capping layer 803, dielectric layer 801 serves as a stopping dielectric to isolate the contact from the gate lines, and SAC stopping layer 301 serves as an etch protect for the spacer sidewalls to allow sufficient dielectric thickness laterally between the contact and the gate.

In FIG. 9B, capping layer 803 and dielectric layer 801 are etched down to replacement gate electrode 701. The opening is filled with a contact material to form a contact 902 to the gate line.

The processes exemplified in FIG. 9A and FIG. 9B can be combined. FIG. 9C illustrates a gate to source/drain contact, i.e., an SRAM cross-coupling. As shown, capping layer 803 and dielectric layer 801 are etched down to replacement gate electrode 701, and capping layer 803, isolation layer 303, and SAC stop layer 301 are etched down to silicide 203. The opening is then filled with a contact material to form contact 903.

The embodiments of the present disclosure can achieve several technical effects, including improved drive current with degradation of the gate dielectric layer, and contacts with improved electrical isolation properties between the gate line and the contact. The present disclosure enjoys industrial applicability in fabricating any of various types of highly integrated semiconductor devices, particularly with a gate pitch of about 80 nm or smaller.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a removable gate electrode over a substrate;
    forming a self aligned contact (SAC) stop layer over the removable gate electrode and the substrate;
    removing a portion of the SAC stop layer over the removable gate electrode;
    removing the removable gate electrode leaving an opening;
    forming a replacement gate electrode, comprising a metal, in the opening;
    transforming an upper portion of the metal into a dielectric layer; and
    forming an SAC.

2. The method according to claim 1, comprising:
    forming spacers on side surfaces of the removable gate electrode; and
    forming the SAC stop layer over the spacers.

3. The method according to claim 1, comprising transforming the upper portion of the metal into a dielectric layer by oxidation or nitriding or fluorinating.

4. The method according to claim 3, wherein the metal comprises aluminum, the method comprising anodizing an upper portion of the aluminum to form aluminum oxide ($Al_2O_3$).

5. The method according to claim 1, wherein the SAC stop layer comprises a dielectric material.

6. The method according to claim 5, wherein the dielectric material comprises a hafnium oxide, aluminum oxide, or a silicon carbide.

7. The method according to claim 6, wherein the dielectric material comprises a hafnium oxide.

8. The method according to claim 5, comprising depositing the dielectric material by atomic layer deposition at a thickness of about 1 to about 10 nm.

9. The method according to claim 2, further comprising:
    forming a hardmask layer on the removable gate electrode; and
    forming a silicide in a substrate region spaced from the removable gate electrode by the spacers, prior to depositing the SAC stop layer.

10. The method according to claim 9, further comprising:
    providing an isolation material on the region after forming the SAC stop layer;
    forming the replacement gate electrode;
    transforming the upper portion of the metal into the dielectric layer; and
    etching, with a high etch selectivity to the isolation material with respect to the dielectric layer, to remove isolation material to form a contact hole.

11. The method according to claim 10, wherein the etch selectivity to the isolation material with respect to the dielectric layer is about 4:1 or greater.

12. A method comprising:
    forming a first gate electrode over a substrate, the first gate electrode comprising a high-K gate dielectric layer, a metal layer on the gate dielectric layer, and polysilicon;
    forming spacers on side surfaces of the first gate electrode;
    forming a hardmask over the polysilicon;
    forming a silicide on the substrate;
    depositing an SAC stop layer over the hardmask layer, the spacers, and the silicide;
    depositing an isolation material over the SAC stop layer;
    forming a replacement gate electrode by:
        removing the hardmask layer and the polysilicon from the first gate electrode to form an opening;
        depositing a metal lining in the opening; and
        depositing aluminum on the metal lining in the opening;
    anodizing an upper portion of the aluminum to form a layer of aluminum oxide ($Al_2O_3$);
    etching, with a high etch selectivity to the isolation material with respect to the $Al_2O_3$ layer, to remove isolation material to form the contact hole and/or to remove the $Al_2O_3$ from the replacement gate electrode; and
    forming an SAC on the silicide and/or the replacement gate electrode.

* * * * *